(12) United States Patent
Goto et al.

(10) Patent No.: US 6,529,003 B2
(45) Date of Patent: *Mar. 4, 2003

(54) GRADIENT COIL SYSTEM FOR USE IN MRI APPARATUS WITH UNIQUE WIRING ARRANGEMENT

(75) Inventors: Takao Goto, Tokyo (JP); Yuji Inoue, Tokyo (JP)

(73) Assignee: GE Yokogawa Medical Systems, Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/546,223

(22) Filed: Apr. 10, 2000

(65) Prior Publication Data

US 2002/0135368 A1 Sep. 26, 2002

(30) Foreign Application Priority Data

Jun. 21, 1999 (JP) .......................... 11-173553

(51) Int. Cl.$^7$ ................................. G01V 3/00
(52) U.S. Cl. ...................... 324/318; 324/322
(58) Field of Search .................. 324/318, 322, 324/320, 309, 307

(56) References Cited

U.S. PATENT DOCUMENTS

| | | | | |
|---|---|---|---|---|
| 4,636,728 A | * | 1/1987 | Compton et al. | 324/309 |
| 4,646,024 A | * | 2/1987 | Schenck et al. | 324/307 |
| 4,686,473 A | * | 8/1987 | Chesneau et al. | 324/319 |
| 4,829,252 A | * | 5/1989 | Kaufman | 324/309 |
| 4,840,700 A | * | 6/1989 | Edelstein et al. | 216/22 |
| 4,862,086 A | | 8/1989 | Maeda | |
| 5,166,619 A | * | 11/1992 | Ries | 324/318 |
| 5,283,544 A | | 2/1994 | Sakurai et al. | 335/297 |
| 5,363,078 A | * | 11/1994 | Ries et al. | 324/319 |
| 5,581,187 A | * | 12/1996 | Pausch | 324/318 |
| 5,610,521 A | * | 3/1997 | Zou et al. | 324/318 |
| 5,630,415 A | * | 5/1997 | Kaufman | 324/318 |
| 5,631,616 A | * | 5/1997 | Ohta et al. | 324/318 |
| 5,706,575 A | | 1/1998 | Kaufman | |
| 5,760,582 A | | 6/1998 | Morrone | |
| 5,864,275 A | * | 1/1999 | Ohashi et al. | 324/319 |
| 5,874,831 A | * | 2/1999 | Yi et al. | 324/318 |
| 5,936,502 A | * | 8/1999 | Englund et al. | 335/299 |
| 6,054,854 A | * | 4/2000 | Kawamoto | 324/318 |
| 6,144,204 A | * | 11/2000 | Sementchenko | 324/318 |
| 6,249,121 B1 | * | 6/2001 | Boskamp et al. | 324/318 |
| 6,285,188 B1 | * | 9/2001 | Sakakura | 324/318 |

FOREIGN PATENT DOCUMENTS

| | | |
|---|---|---|
| JP | 1025510 | 1/1989 |
| JP | 3188827 | 8/1991 |
| JP | 6014900 | 1/1994 |
| JP | 08335511 A | * 12/1996 |
| JP | 408335511 A | * 12/1996 |

OTHER PUBLICATIONS

Haiying Liu "True energy iminmal and finite sized biplanar gradient coil design for MRI" IEEE Transaction on Medical Imaging, Oct. 1998, IEEE, vo. 17,No. 5, pp. 826–830. (copy filed herewith).

* cited by examiner

Primary Examiner—Edward Lefkowitz
Assistant Examiner—Dixomara Vargas
(74) Attorney, Agent, or Firm—Moonray Kojima

(57) ABSTRACT

In order to obtain good linearity without reducing efficiency in generating a magnetic field, a winding pattern of one semicircular spiral is assumed; an electric current distribution is expressed by a continuous function $J_x(x)$ such that an x-axis electric current distribution profile does not lie in both the positive and negative polarities; parameters of the continuous function $J_x(x)$ are optimized so that desired linearity can be obtained; and a position of a straight-line portion 1Xt1L of the semicircular spiral is determined so that the electric current distribution profile given by the optimized continuous function $J_x(x)$ is fulfilled. The resulting pattern is symmetrically duplicated to generate a gradient coil unit 1Xt, and a plurality of the gradient coil units 1Xt are combined to form a gradient coil.

13 Claims, 8 Drawing Sheets

100
MRI apparatus

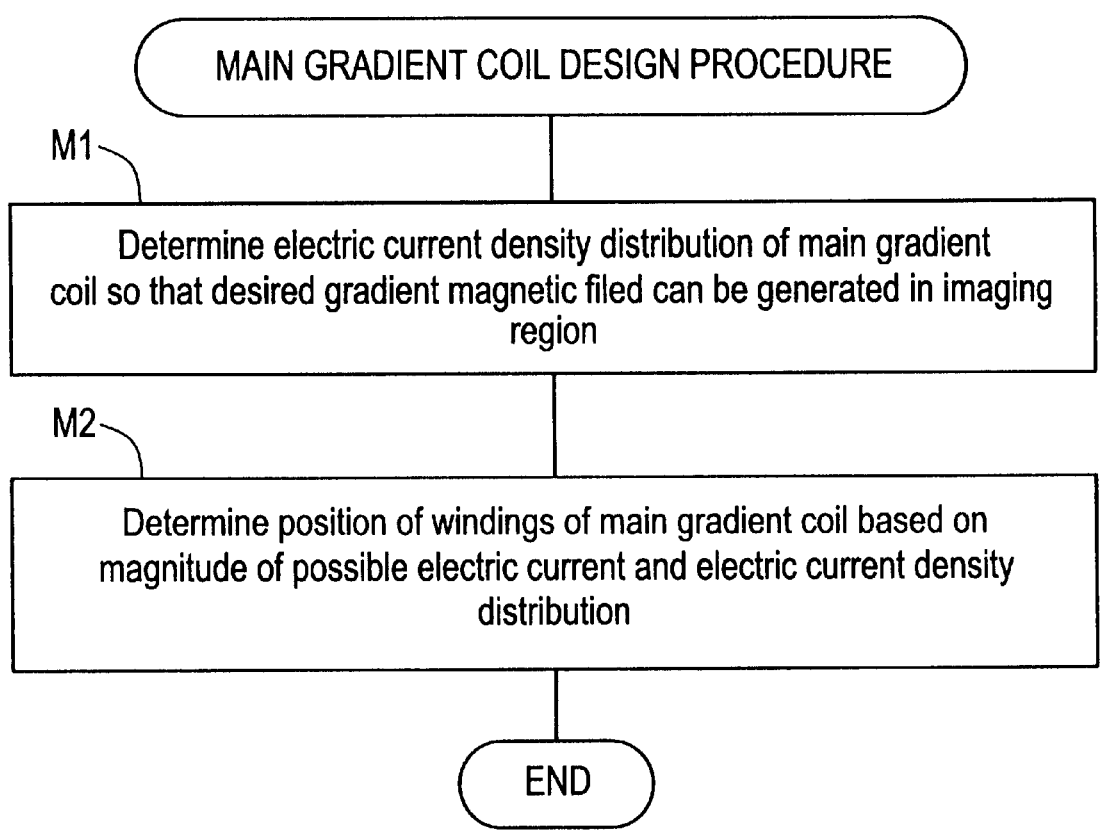

GRADIENT COIL SYSTEM FOR USE IN MRI APPARATUS WITH UNIQUE WIRING ARRANGEMENT

BACKGROUND OF THE INVENTION

The present invention relates to a method of manufacturing a gradient coil, a gradient coil unit, a gradient coil and an MRI (magnetic resonance imaging) apparatus, and more particularly to a method of manufacturing a gradient coil, a gradient coil unit, a gradient coil and an MRI apparatus which can provide good linearity without reducing efficiency in generating a magnetic field.

In "Method of Manufacturing Gradient Coil, Gradient Coil unit and Gradient Coil" disclosed in Japanese Patent Application Laid Open No. 6-14900, a winding pattern of a gradient coil is basically determined as follows:

(1) A winding pattern is assumed to have a plurality of bow-shaped spirals as shown in FIG. 1, and its electric current distribution in the r-direction is expressed by Eq. (2) below and that in the φ-direction is expressed by Eq. (3):

$$J_r = -\frac{R_0}{r}\left\{\sum_n S_n \cdot \sin\left(\frac{n\pi r}{R_0}\right) + \sum_m C_m \cdot \cos\left(\frac{2m\pi r}{R_0}\right)\right\}\sin\phi, \text{ and} \quad (2)$$

$$J_\phi = \left\{-\sum_n S_n \cdot n\pi \cdot \cos\left(\frac{n\pi r}{R_0}\right) + \sum_m C_m \cdot 2m\pi \cdot \sin\left(\frac{2m\pi r}{R_0}\right)\right\}\cos\phi, \quad (3)$$

wherein r is a position in the radial direction, φ is a position in the angular direction, $R_0$ is a maximum radius, and $S_n$, n, $C_m$ and m are parameters to be manipulated for optimization.

(2) Optimum values for $S_n$, n, $C_m$ and m are obtained at φ=0. Specifically, appropriate values for $S_n$, n, $C_m$ and m are assumed to calculate an linearity error of a magnetic field in a required region, and $S_n$, n, $C_m$ and m are manipulated so that the linearity error falls within an allowable value, to obtain the optimum values.

(3) An electric current distribution profile on a line φ=0 is obtained from Eq. (3) with the resulting $S_n$, n, $C_m$ and m substituted. $A_p$, which is the sum of the areas of small regions enclosed by a line $J_\phi$=0 and a positive part of the electric current distribution profile from the line $J_{101}$=0, is divided by the number N of positions at which the windings of the gradient coil intersect the line φ=0, and the resulting value is defined as $\Delta A_p$.

(4) The entire region enclosed by the line $J_\phi$=0 and the positive part of the electric current distribution profile from the line $J_\phi$=0 is separated by $\Delta A_p$ into sub-regions. An r-position in the middle of each sub-region is defined as a position at which each of the windings intersects the line φ=0.

(5) The steps (3)–(4) are repeated while sequentially varying the value of φ within a first quadrant to obtain a winding pattern in the first quadrant as shown in FIG. 2.

(6) The resulting winding pattern in the first quadrant is duplicated symmetrically with respect to the x-axis (the line φ=0) to obtain a winding pattern for a fourth quadrant with the direction of electric current inverted. Moreover, a pattern for connecting the winding patterns in the first and fourth quadrants is added, considering the direction of electric current, so that one coil is formed as a whole. A winding pattern on one side is thus obtained.

(7) The winding pattern on one side is duplicated symmetrically with respect to the y-axis (an axis orthogonal to the x-axis). A winding pattern of a gradient coil unit is thus obtained.

(8) A plurality of the gradient coil units are combined.

In the conventional winding pattern of the gradient coil as above (cf. FIGS. 1 and 2), some adjacent paths carry electric current flowing in the opposite directions at some locations (in FIG. 2, at four locations).

For this reason, although good linearity can be obtained, efficiency in generating a magnetic field is reduced.

SUMMARY OF THE INVENTION

It is therefore an object of the present invention to provide a method of manufacturing a gradient coil, a gradient coil unit, a gradient coil and an MRI apparatus which can provide good linearity without reducing efficiency in generating a magnetic field.

In accordance with a first aspect of the invention, there is provided a method of manufacturing a gradient coil, comprising the steps of:

(1) assuming a winding pattern of one semicircular spiral, and expressing its x-axis electric current distribution by the following electric current distribution equation:

$$J_x(x) = \sum_n A_n \cdot \sin\left(\frac{\pi}{2}n\frac{x}{R_0}\right) + \sum_m B_m \cdot \sin\left(\frac{\pi}{2}m\frac{x}{R_0}\right),$$

wherein the x-axis is an axis dividing the semicircular spiral into two equal parts, $R_0$ is a maximum radius, and $A_n$, n, $B_m$ and m are parameters to be manipulated for optimization;

(2) assuming appropriate values for $A_n$, n, $B_m$ and m so that an x-axis electric current distribution profile expressed by the electric current distribution equation with the values for $A_n$, n, $B_m$ and m substituted does not lie in both the positive and negative polarities, calculating a linearity error of a magnetic field at a plurality of magnetic field measurement points, and manipulating $A_n$, n, $B_m$ and m so that the linearity error falls within an allowable value, to obtain optimum values for $A_n$, n, $B_m$ and m;

(3) dividing an area $A_p$ of a region enclosed by the electric current distribution profile and a line $J_x$=0 by the number N of positions at which line members constituting a straight-line portion of the semicircular spiral intersect the x-axis, and defining the resulting value as $\Delta A_p$;

(4) separating the region enclosed by the electric current distribution profile and the line $J_x$=0 by $\Delta A_p$ into sub-regions, and defining an x-position in the middle of each sub-region as a position at which each line member of the straight-line portion of the semicircular spiral intersects the x-axis;

(5) forming an arc-shaped portion of the semicircular spiral as a semicircle having a radius of $R_0$, thereby generating a winding pattern on one side;

(6) symmetrically duplicating the winding pattern on one side with the respective straight-line portions adjacent to each other, thereby generating a winding pattern of a gradient coil unit; and (7) combining a plurality of the gradient coil units.

In the method of manufacturing a gradient coil of the first aspect, a winding pattern of one semicircular spiral is assumed; its electric current distribution is expressed by a continuous function such that an x-axis electric current distribution profile does not lie in both the positive and negative polarities; parameters of the continuous function are optimized so that desired linearity can be obtained; and a position of each line member constituting a straight-line portion of the semicircular spiral is determined so that the electric current distribution profile given by the optimized continuous function is fulfilled. Then, the resulting pattern is symmetrically duplicated to generate a gradient coil unit, and a plurality of the gradient coil units are combined to form a gradient coil. This provides good linearity, and avoids reduction in efficiency in generating a magnetic field because employing a winding pattern of a semicircular spiral provides only two locations at which adjacent paths carry electric current flowing in the opposite directions, and besides the paths are well apart from each other.

In accordance with a second aspect of the invention, there is provided the method of manufacturing a gradient coil as described regarding the first aspect, wherein the plurality of magnetic field measurement points are points on a sphere that does not contain an electric current element.

In the method of manufacturing a gradient coil of the second aspect, the linearity is inspected selecting as magnetic field measurement points a plurality of points on a sphere that does not contain an electric current element, and therefore the linearity is assured also in the interior of the sphere. Thus, the calculation time can be reduced because only a small number of magnetic field measurement points on the sphere are needed for calculation.

In accordance with a third aspect of the invention, there is provided a gradient coil unit having a general structure such that a pair of winding patterns, each formed of one semicircular spiral, is symmetrically disposed with their respective straight-line portions adjacent to each other, wherein, when an axis dividing the semicircular spiral into two equal parts is defined as an x-axis, an x-axis electric current distribution generated by passing electric current through one of the semicircular spirals is basically expressed by a continuous function that does not lie in both the positive and negative polarities.

In the gradient coil unit of the third aspect, since employing a winding pattern of a semicircular spiral having an electric current distribution basically expressed by a continuous function that does not lie in both the positive and negative polarities, provides only two locations at which adjacent paths carry electric current flowing in the opposite directions, and besides the paths are well apart from each other, reduction in efficiency in generating a magnetic field can be avoided. Moreover, good linearity can be obtained by optimizing parameters of the continuous function so that desired linearity can be obtained.

In accordance with a fourth aspect of the invention, there is provided the gradient coil unit as described regarding the third aspect, wherein the continuous function consists of a combination of orthogonal functions.

In the gradient coil unit of the fourth aspect, since a continuous function consisting of a combination of orthogonal functions is employed, a calculation can be performed as separate processes, thereby making the calculation process easy.

In accordance with a fifth aspect of the invention, there is provided a gradient coil comprising a combination of a plurality of the gradient coil units as described regarding the third or fourth aspect.

In the gradient coil of the fifth aspect, since employing a winding pattern of a semicircular spiral having an electric current distribution basically expressed by a continuous function that does not lie in both the positive and negative polarities, provides only two locations at which adjacent paths carry electric current flowing in the opposite directions, and besides the paths are well apart from each other, reduction in efficiency in generating a magnetic field can be avoided. Moreover, good linearity can be obtained by optimizing parameters of the continuous function so that desired linearity can be obtained.

In accordance with a sixth aspect of the invention, there is provided an MRI apparatus comprising the gradient coil as described regarding the fifth aspect.

In the MRI apparatus of the sixth aspect, since employing a gradient coil having a winding pattern of a semicircular spiral and having an electric current distribution basically expressed by a continuous function that does not lie in both the positive and negative polarities, provides only two locations at which adjacent paths carry electric current flowing in the opposite directions, and besides the paths are well apart from each other, reduction in efficiency in generating a magnetic field can be avoided, thereby reducing electricity consumption. Moreover, since good linearity can be obtained by optimizing parameters in the continuous function so that desired linearity can be obtained, image quality can be improved.

Thus, according to the method of manufacturing a gradient coil, the gradient coil unit, the gradient coil and the MRI apparatus of the present invention, good linearity can be obtained without reducing efficiency in generating a magnetic field.

Further objects and advantages of the present invention will be apparent from the following description of the preferred embodiments of the invention as illustrated in the accompanying drawings.

DETAILED DESCRIPTION OF THE INVENTION

The present invention will now be described in more detail with reference to the several embodiments thereof shown in the accompanying drawings.

Figure 1:
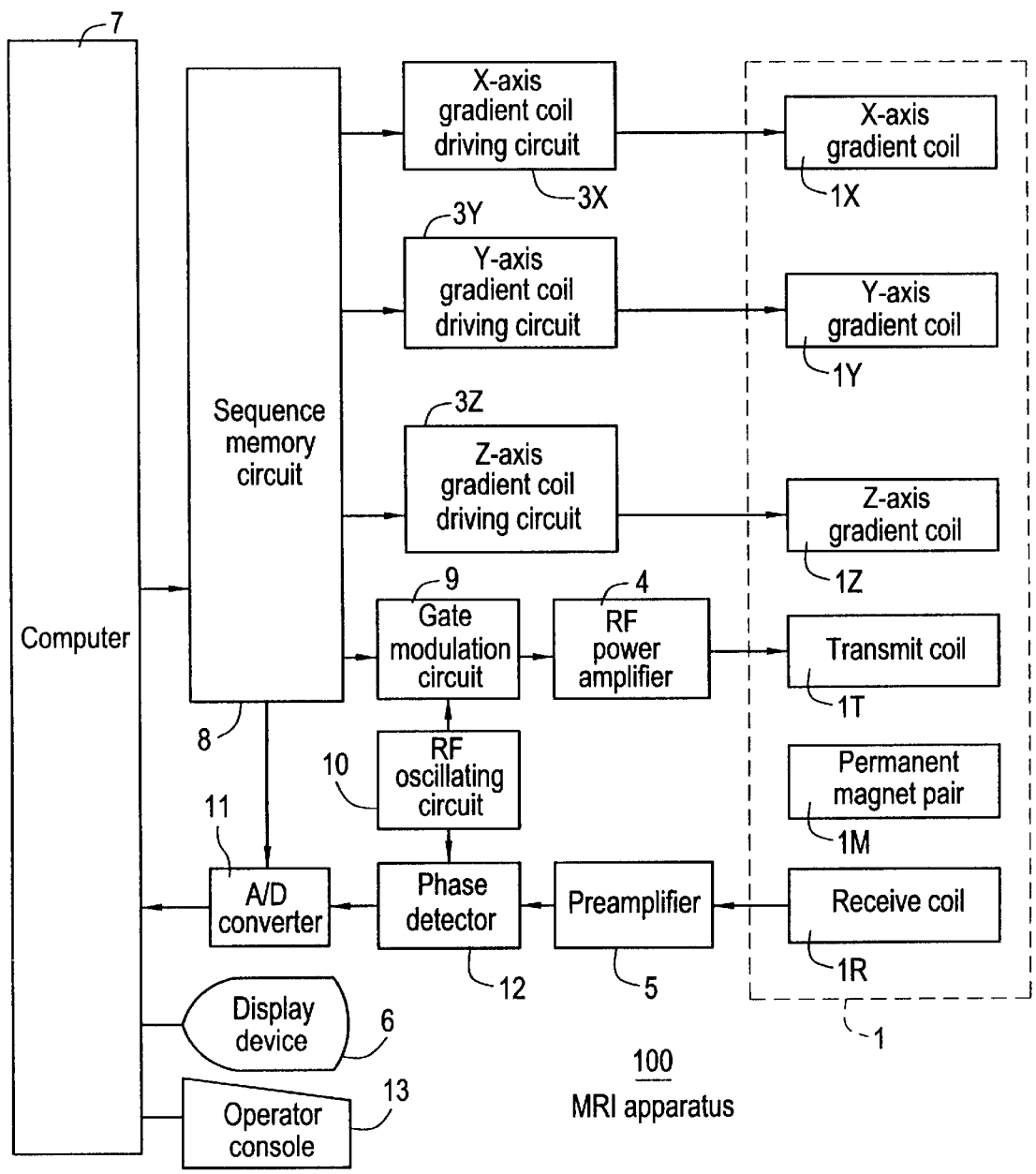
FIG. 1 is a diagram for explaining a conventional gradient coil unit.
Figure 2:
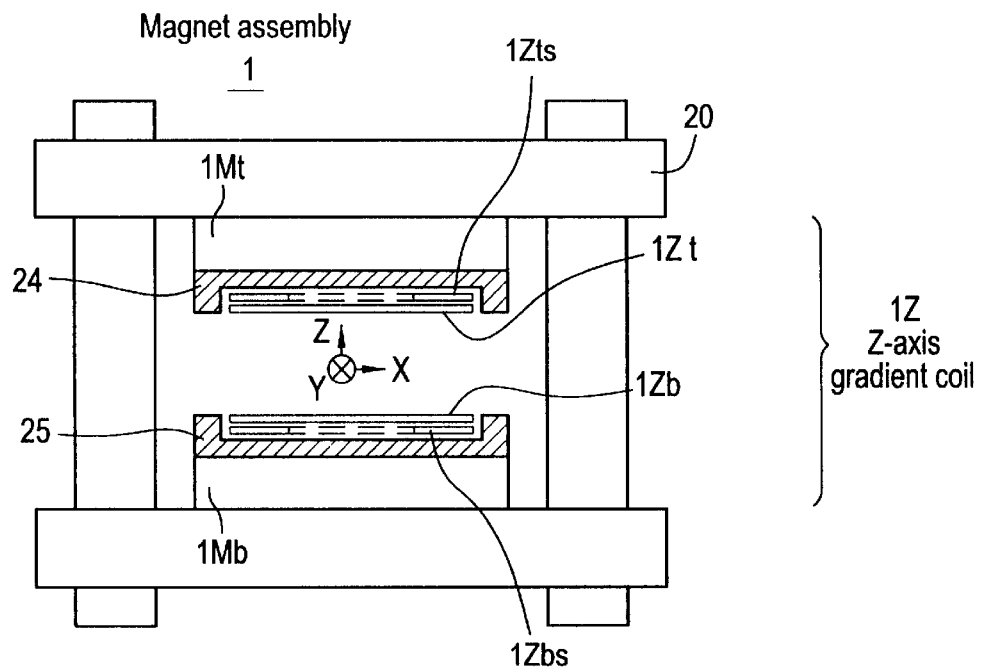
FIG. 2 a diagram for explaining the conventional gradient coil unit after being optimized.
Figure 3:
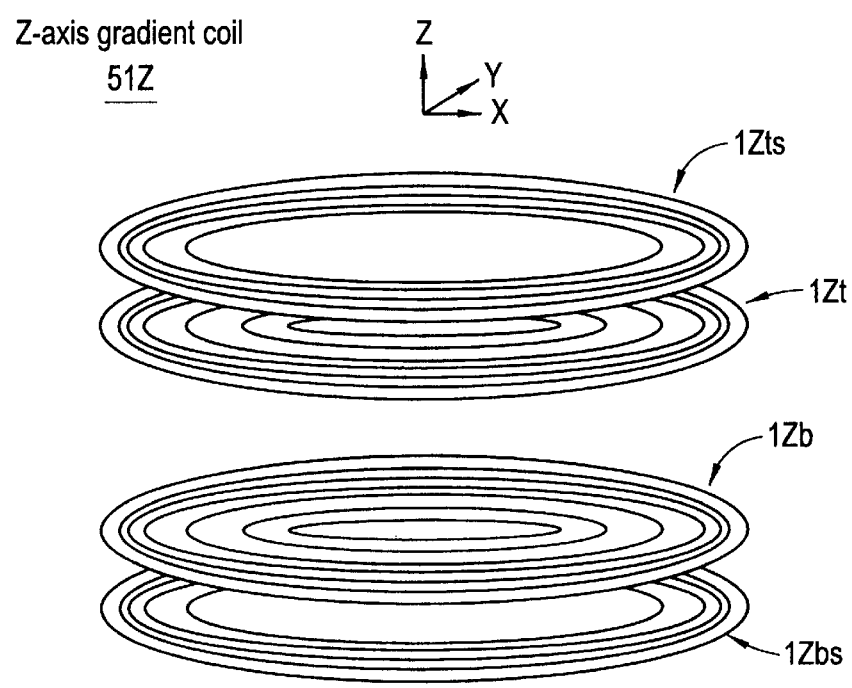
FIG. 3 is a configuration block diagram showing an MRI apparatus in accordance with an embodiment of the present invention.

FIG. 3 is a configuration block diagram showing an MRI apparatus in accordance with an embodiment of the present invention.

In the MRI apparatus 100, a magnet assembly 1 has therein a bore (vacant portion) into which a subject is inserted, and surrounding the bore, the magnet assembly 1 comprises an X-axis gradient coil 1X for generating an X-axis gradient magnetic field, a Y-axis gradient coil 1Y for generating a Y-axis gradient magnetic field, a Z-axis gradient coil 1Z for generating a Z-axis gradient magnetic field, a transmit coil 1T for applying RF pulses to excite spins of atomic nuclei within the subject, a receive coil 1R for detecting NMR signals from the subject, and a permanent magnet pair 1M for generating a static magnetic field.

It should be noted that a superconductive magnet may be used instead of the permanent magnet pair 1M.

The X-axis gradient coil 1X is connected to an X-axis gradient coil driving circuit 3X. The Y-axis gradient coil 1Y is connected to a Y-axis gradient coil driving circuit 3Y. The Z-axis gradient coil 1Z is connected to a Z-axis gradient coil driving circuit 3Z. The transmit coil 1T is connected to an RF power amplifier 4. The receive coil 1R is connected to a preamplifier 5.

A sequence memory circuit 8 operates the X-, Y- and Z-axis gradient coil driving circuits 3X, 3Y and 3Z according to instructions from a computer 7 based on a pulse sequence of a spin-echo technique or the like, to generate an X-axis gradient magnetic field, Y-axis gradient magnetic field and Z-axis gradient magnetic field from the X-, Y- and Z-axis gradient coils 1X, 1Y and 1Z, respectively. The sequence memory circuit 8 also operates a gate modulation circuit 9 to modulate a high frequency output signal from an RF oscillating circuit 10 into a pulsed signal having a predetermined timing and a predetermined envelope, and applies the pulsed signal to the RF power amplifier 4 as an excitation pulse. After power-amplified in the RF power amplifier 4, the signal is applied to the transmit coil 1T in the magnet assembly 1 to selectively excite a target slice region.

The preamplifier 5 amplifies an NMR signal from the subject detected by the receive coil 1R in the magnet assembly 1, and inputs the signal into a phase detector 12. The phase detector 12 phase-detects the NMR signal from the preamplifier 5 with the output from the RF oscillating circuit 10 as a reference signal, and supplies the phase-detected signal to an A/D converter 11. The AID converter 11 converts the phase-detected analog signal to digital MR signal data, and inputs it to the computer 7.

The computer 7 performs an image reconstruction calculation on the MR data to produce an image of the target slice region. The image is displayed on a display device 6. The computer 7 is also responsible for overall control such as accepting information input from an operator console 13.

Figure 4:
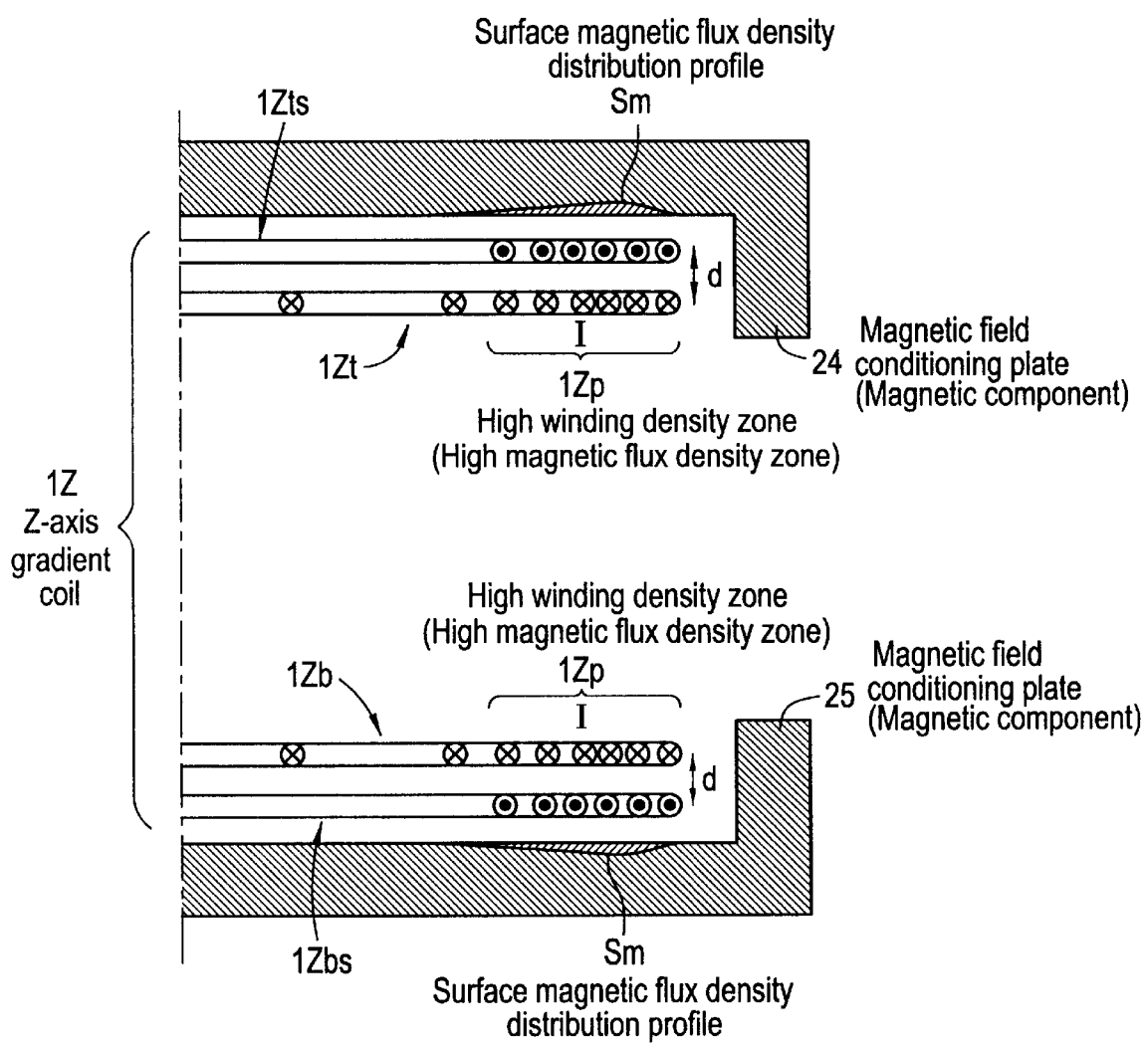
FIG. 4 is a schematic view showing the main portion of a magnet assembly in the MRI apparatus of FIG. 3.

FIG. 4 is a schematic view illustrating the main portion (which relates to the present invention) of the magnet assembly 1.

The magnet assembly 1 comprises yokes 20, a pair of opposing permanent magnets 1Mt and 1Mb attached to the yokes 20 for generating a static magnetic field, magnetic field conditioning plates 24 and 25 disposed on the opposing surfaces of the permanent magnets 1Mt and 1Mb, respectively, for improving homogeneity of the static magnetic field, and upper and lower X-axis gradient coil units 1Xt and 1Xb disposed on the opposing surfaces of the magnetic field conditioning plates 24 and 25, respectively, for generating the X-axis gradient magnetic field.

A structure having a combination of the upper and lower X-axis gradient coil units 1Xt and 1Xb facing each other in the Z-direction constitutes an X-axis gradient coil 1X.

Although omitted in the drawings, the Y- and Z-axis gradient coils 1Y and 1Z are also disposed on the opposing surfaces of the magnetic field conditioning plates 24 and 25.

Figure 5:
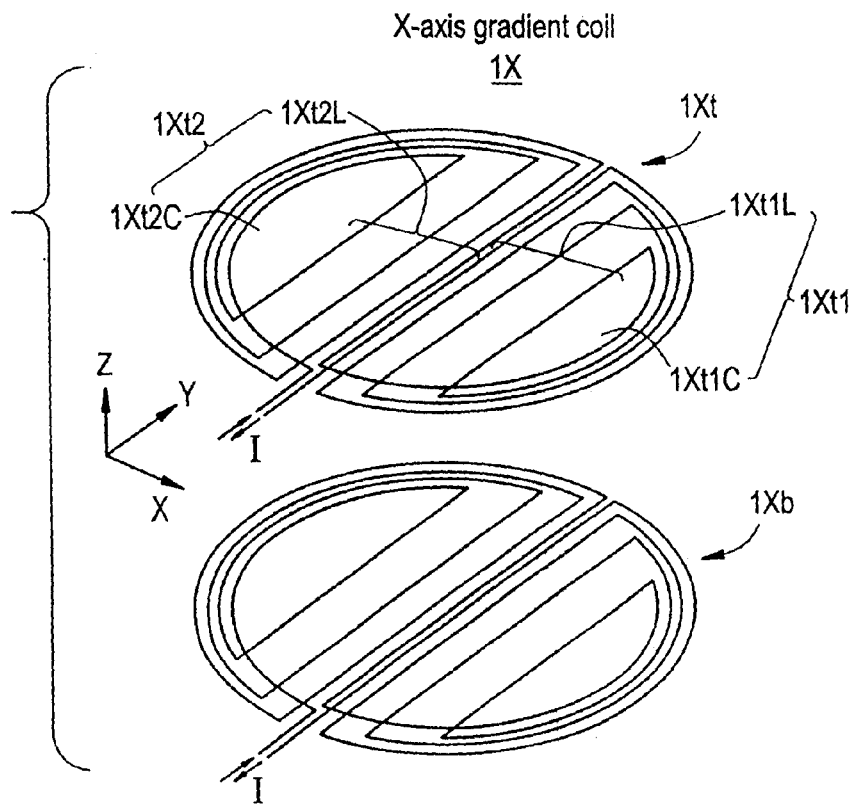
FIG. 5 is a schematic perspective view of an X-axis gradient coil.
Figure 6:
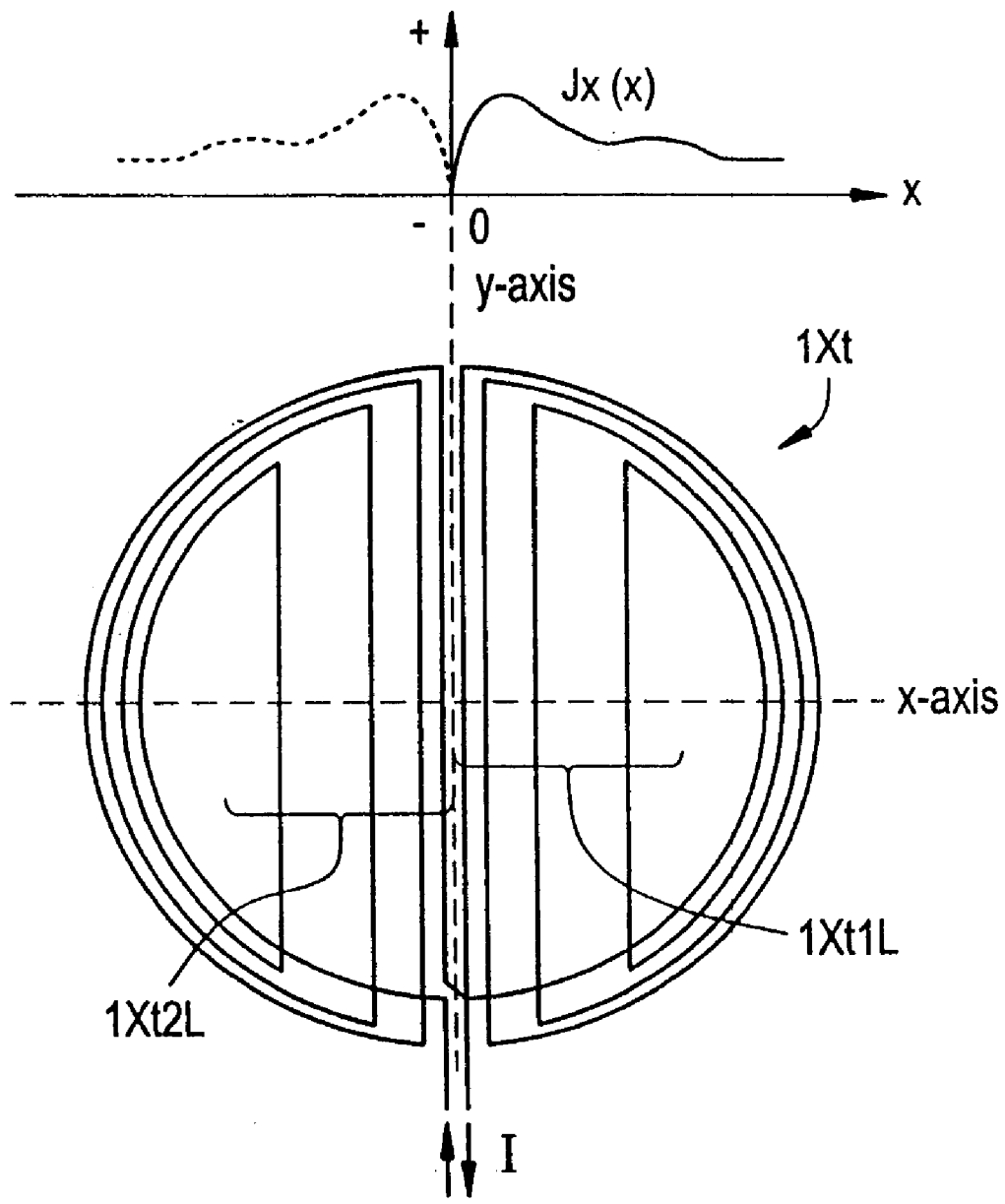
Figure 10:
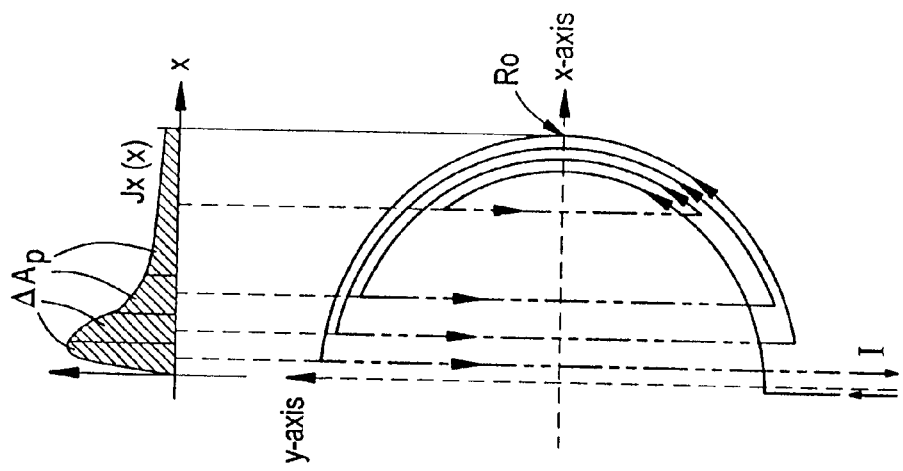
Figure 9:
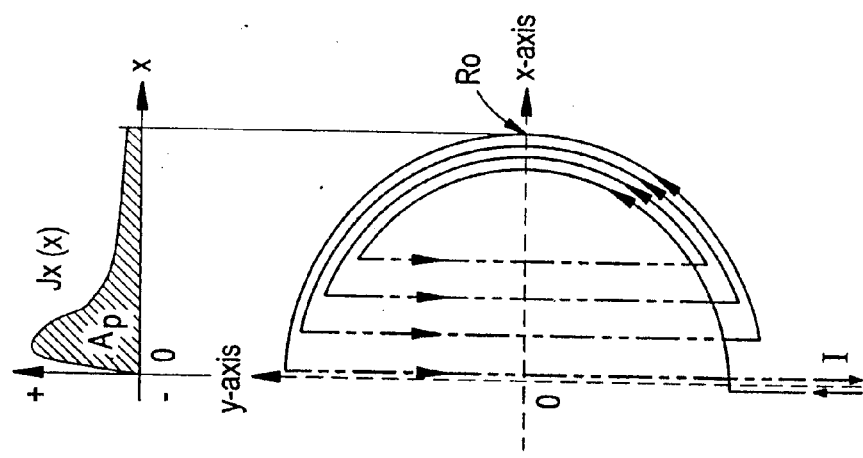
Figure 8:
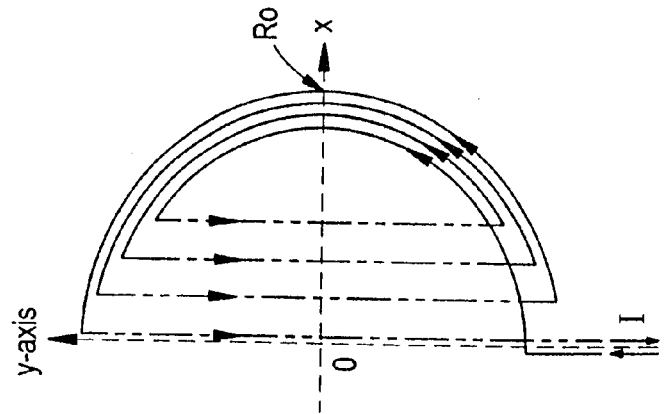
Figure 11:
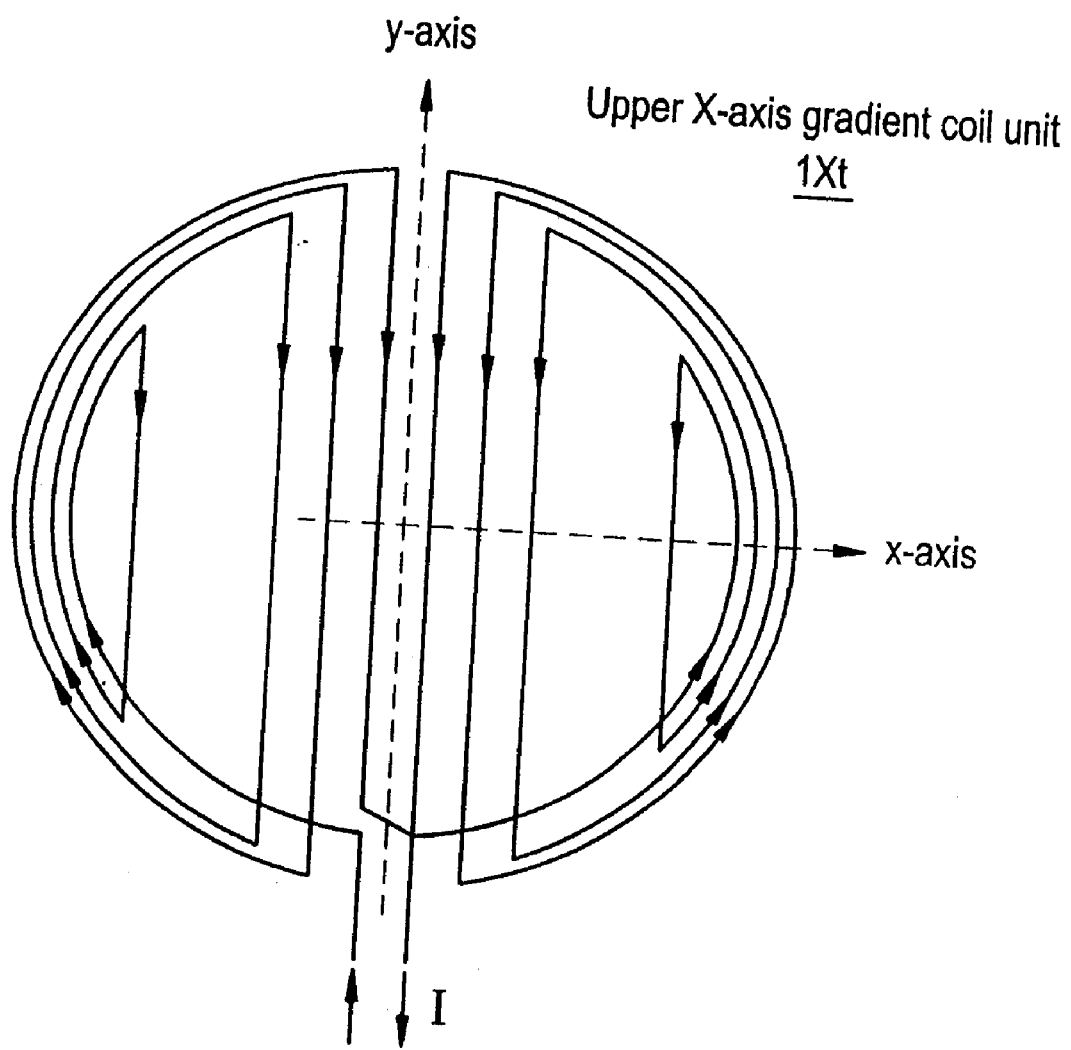
Figure 12:
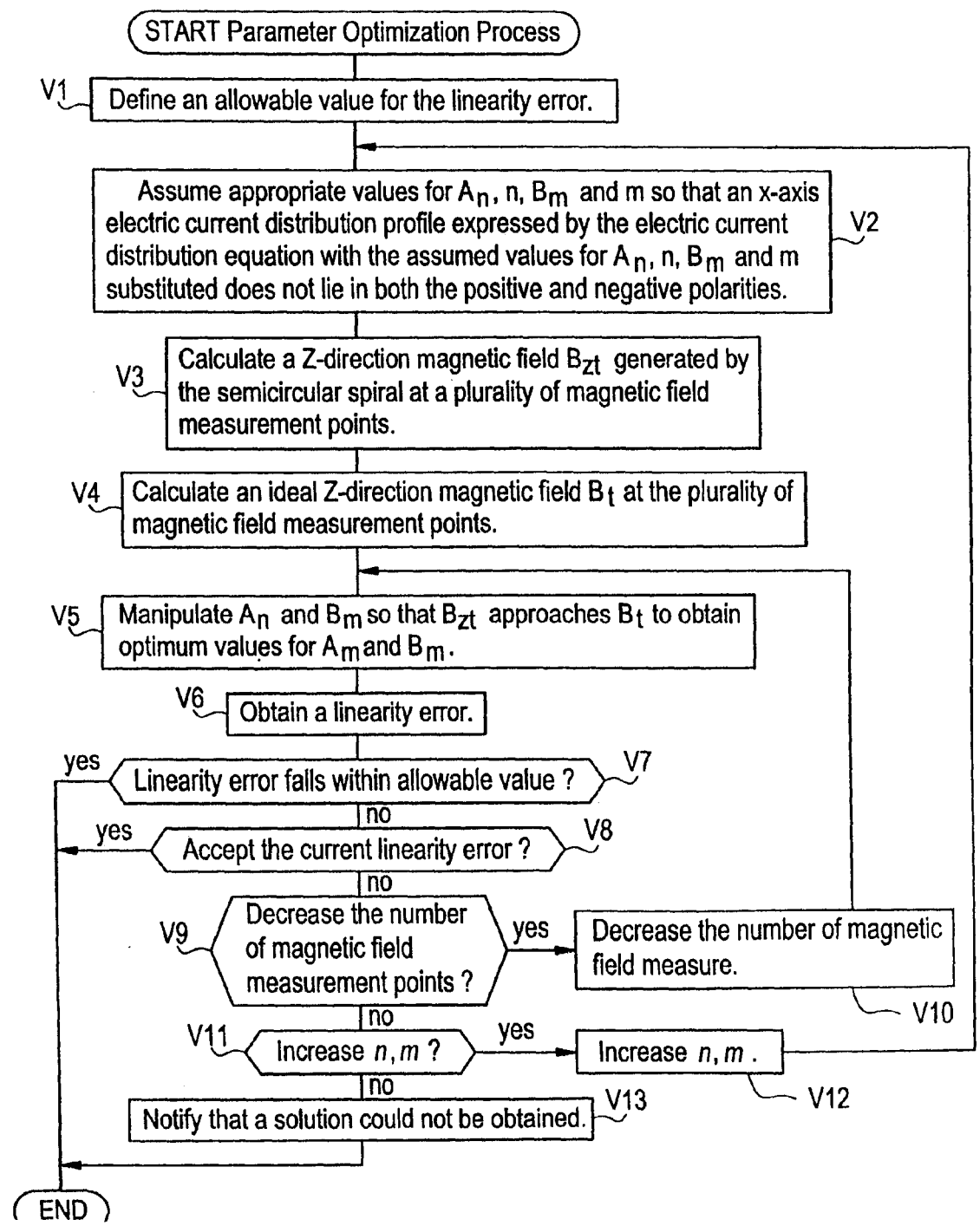

As shown in FIG. 5, the upper X-axis gradient coil unit 1Xt has a general structure such that one semicircular spiral 1xt1 having a straight-line portion 1Xt1L and an arc-shaped portion 1Xt1C, and another semicircular spiral 1Xt2 having a straight-line portion 1Xt2L and an arc-shaped portion 1Xt2C are symmetrically disposed with their respective straight-line portions 1Xt1L and 1Xt2L adjacent to each other.

The lower X-axis gradient coil unit 1Xb has a structure identical to that of the upper X-axis gradient coil unit 1Xt.

Figure 6:
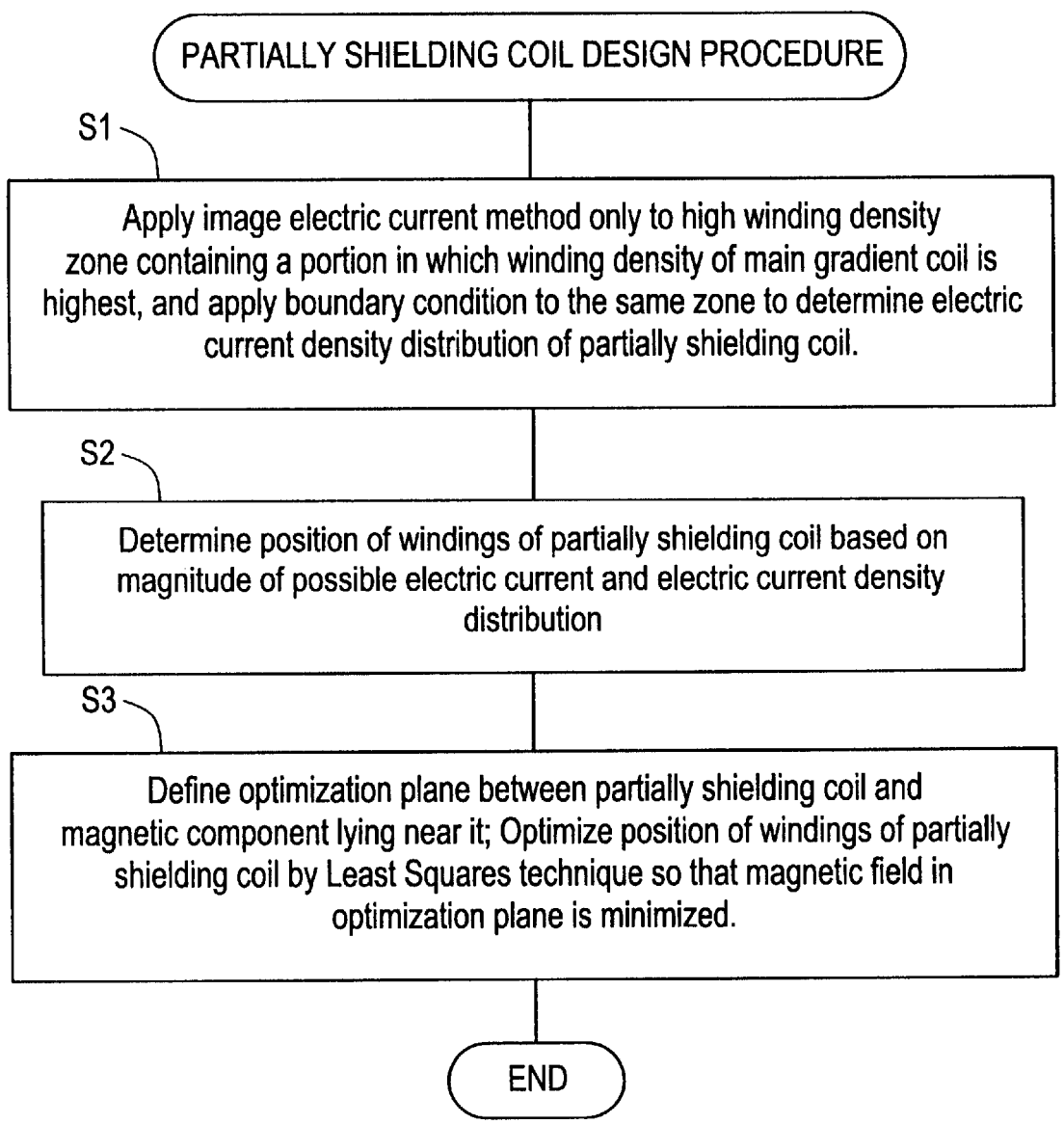
FIG. 6 illustrates an electric current distribution in a gradient coil unit.

As shown in FIG. 6, an x-axis electric current distribution $J_x$ generated in passing gradient electric current I through the upper X-axis gradient coil unit 1Xt is basically expressed by a continuous function that does not lie in both the positive and negative polarities. (The x-axis is an axis dividing the semicircular spirals 1Xt1 and 1Xt2 into two equal parts.) In other words, the distribution (or the position) of the windings of the straight-line portions 1Xt1L and 1Xt2L is to be determined so that the x-axis electric current distribution $J_x$ is obtained.

Figure 7:
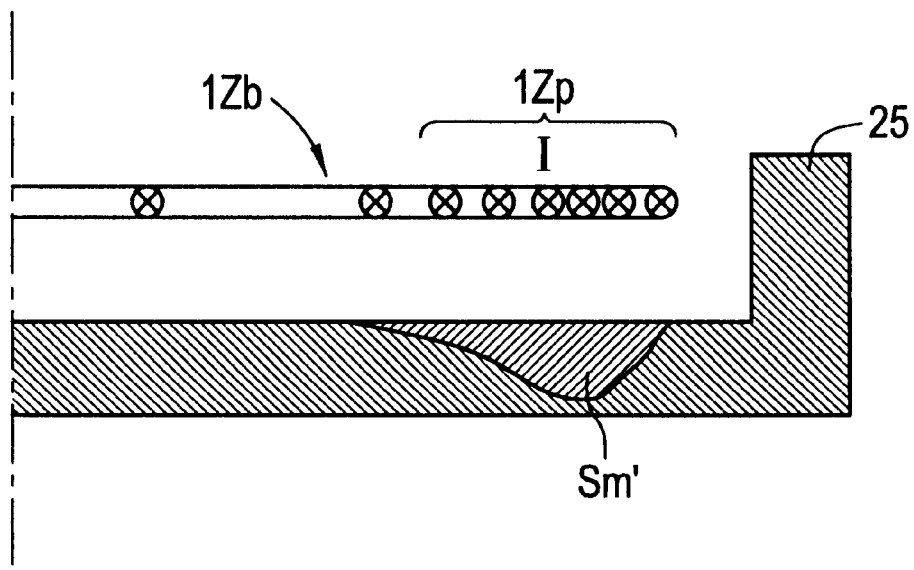
FIG. 7 is a flow chart showing a gradient coil design procedure.

FIG. 7 is a flow chart showing a gradient coil design procedure for manufacturing the X-axis gradient coil 1X.

Figure 8:
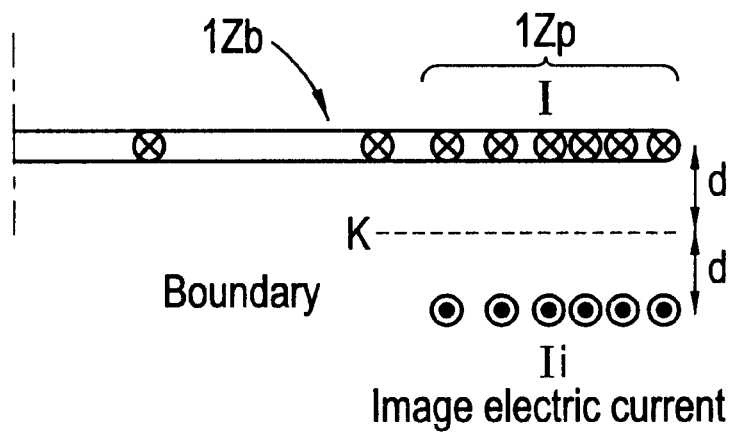
FIG. 8 is a schematic diagram of one semicircular spiral.

In Step S1, a winding pattern of one semicircular spiral as shown in FIG. 8 is assumed, and its x-axis electric current distribution is expressed by the following electric current distribution equation:

$$J_x(x) = \sum_n A_n \cdot \sin\left(\frac{\pi}{2}n\frac{x}{R_0}\right) + \sum_m B_m \cdot \sin\left(\frac{\pi}{2}m\frac{x}{R_0}\right), \quad (1)$$

wherein the x-axis is an axis dividing the semicircular spiral into two equal parts, $R_0$ is a maximum radius, and $A_n$, n, $B_m$ and m are parameters to be manipulated for optimization.

In Step S2, appropriate values for $A_n$, n, $B_m$ and m are assumed (with a proviso that an x-axis electric current distribution profile expressed by the electric current distribution equation with the assumed values for $A_n$, n, $B_m$ and m substituted does not lie in both the positive and negative polarities); a linearity error of a magnetic field at a plurality of magnetic field measurement points, is calculated; and $A_n$, n, $B_m$ and m are manipulated so that the linearity error falls within an allowable value, to obtain optimum values for $A_n$, n, $B_m$ and m.

The optimization process above will be described later with reference to FIG. 12.

Figure 9:
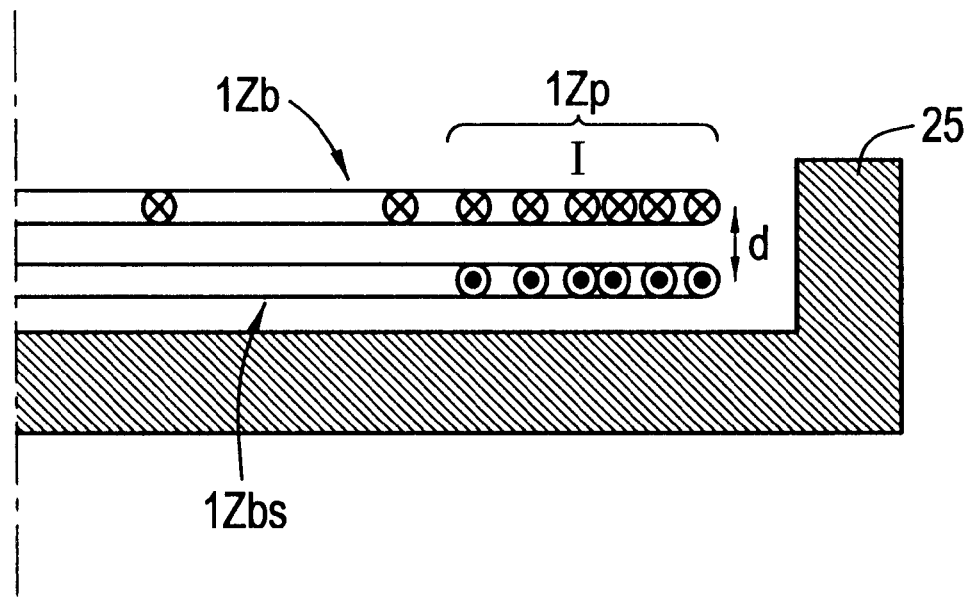
FIG. 9 is an exemplary electric current distribution profile.

In Step S3, and as shown in FIG. 9, an area $A_p$ of a region enclosed by the x-axis electric current distribution profile $J_x(x)$ expressed by the electric current distribution equation with the optimized values for $A_n$, n, $B_m$ and m substituted and a line $J_x=0$ is calculated, and a value of the area $A_p$ divided by the number N of positions at which the windings of the straight-line portion intersect the x-axis (i.e., the number of windings) is defined as $\Delta A_p$.

Figure 10:
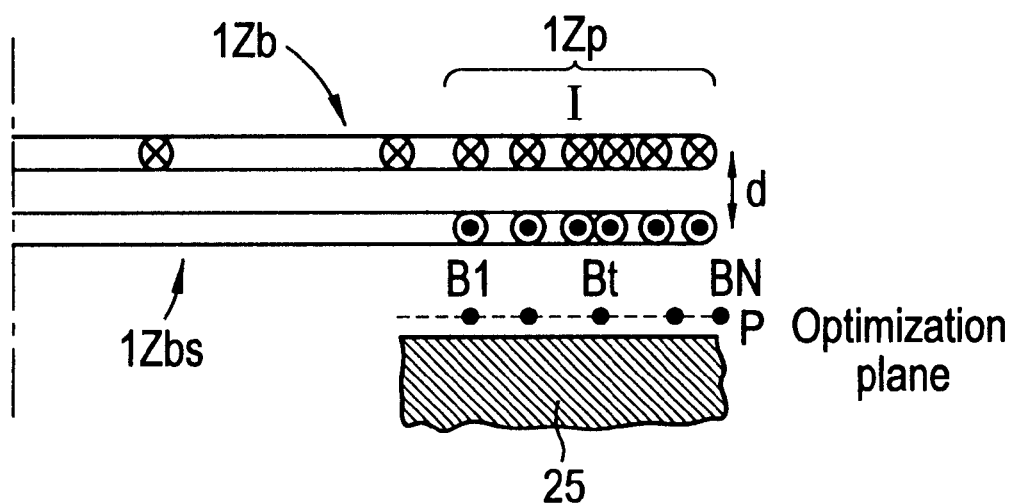
FIG. 10 illustrates the position of windings obtained from the optimized electric current distribution.

In Step S4, and as shown in FIG. 10, the region enclosed by the electric current distribution profile $J_x(x)$ and the line $J_x=0$ is separated by $\Delta A_p$ into sub-regions, and an x-position in the middle of each sub-region is defined as a position at which each winding of the straight-line portion intersects the x-axis (i.e., a position of each winding).

In Step S5, and as shown in FIG. 10, an arc-shaped portion of the semicircular spiral is formed as a semicircle having a radius of $R_0$. Thus, a winding pattern of a semicircular spiral on one side is obtained.

Figure 11:
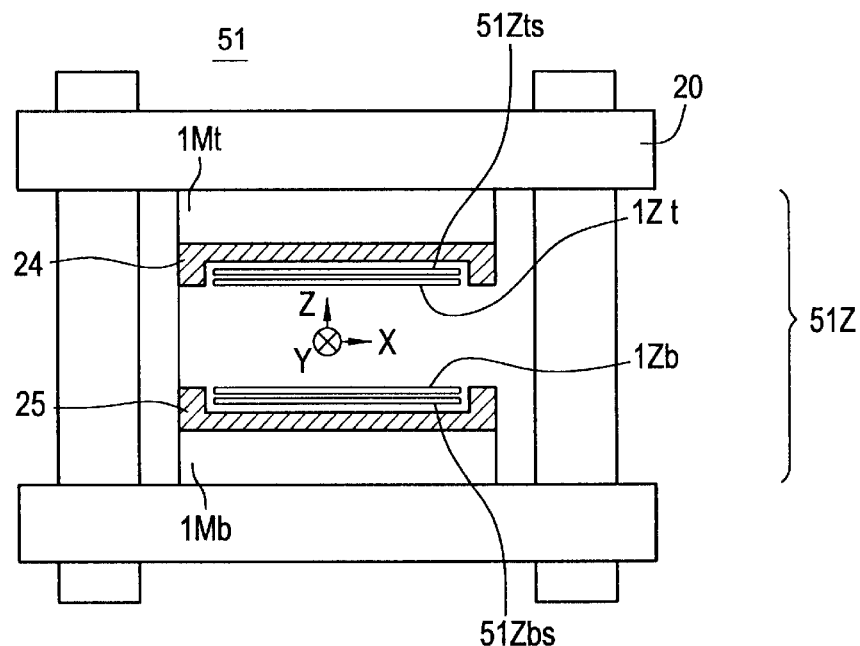
FIG. 11 illustrates a gradient coil unit after being optimized.

In Step S6, and as shown in FIG. 11, the semicircular spiral on one side is symmetrically duplicated with the straight-line portions adjacent to each other to generate a winding pattern of the upper X-axis gradient coil unit 1Xt. The lower X-axis gradient coil unit 1Xb is formed with the identical winding pattern.

In Step S7, and as shown in FIG. 5, the upper and lower X-axis gradient coil units 1Xt and 1Xb are combined facing each other in the Z-direction to form the X-axis gradient coil 1X.

It should be noted that the Y-axis gradient coil 1Y has the same structure as the X-axis gradient coil 1X and has a position different than that of the X-axis gradient coil 1X by 90°.

Figure 12:
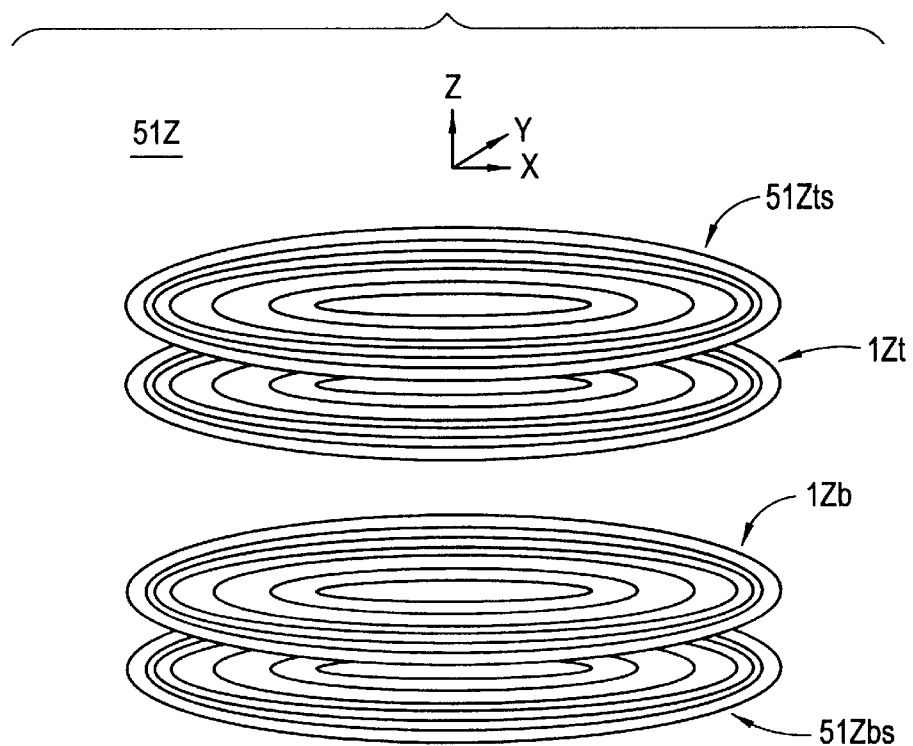
FIG. 12 is a flow chart of an optimization process.
Figure 1:
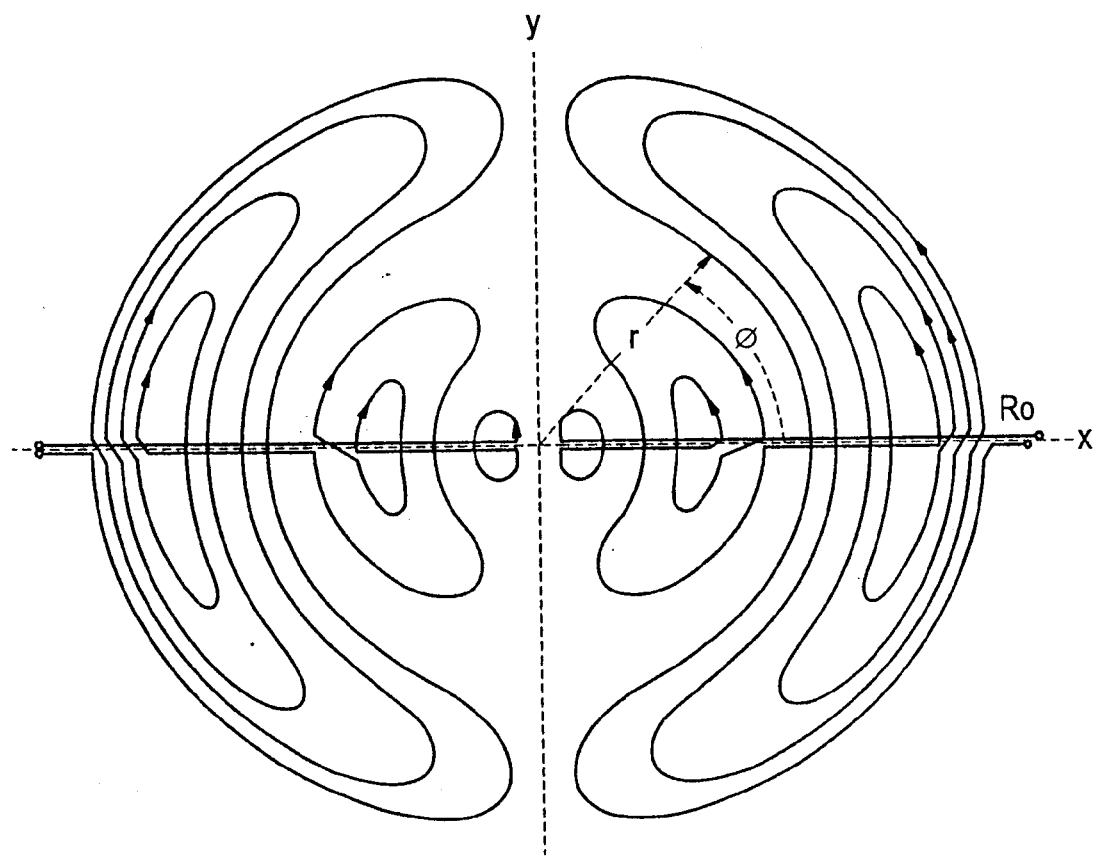
Figure 2:
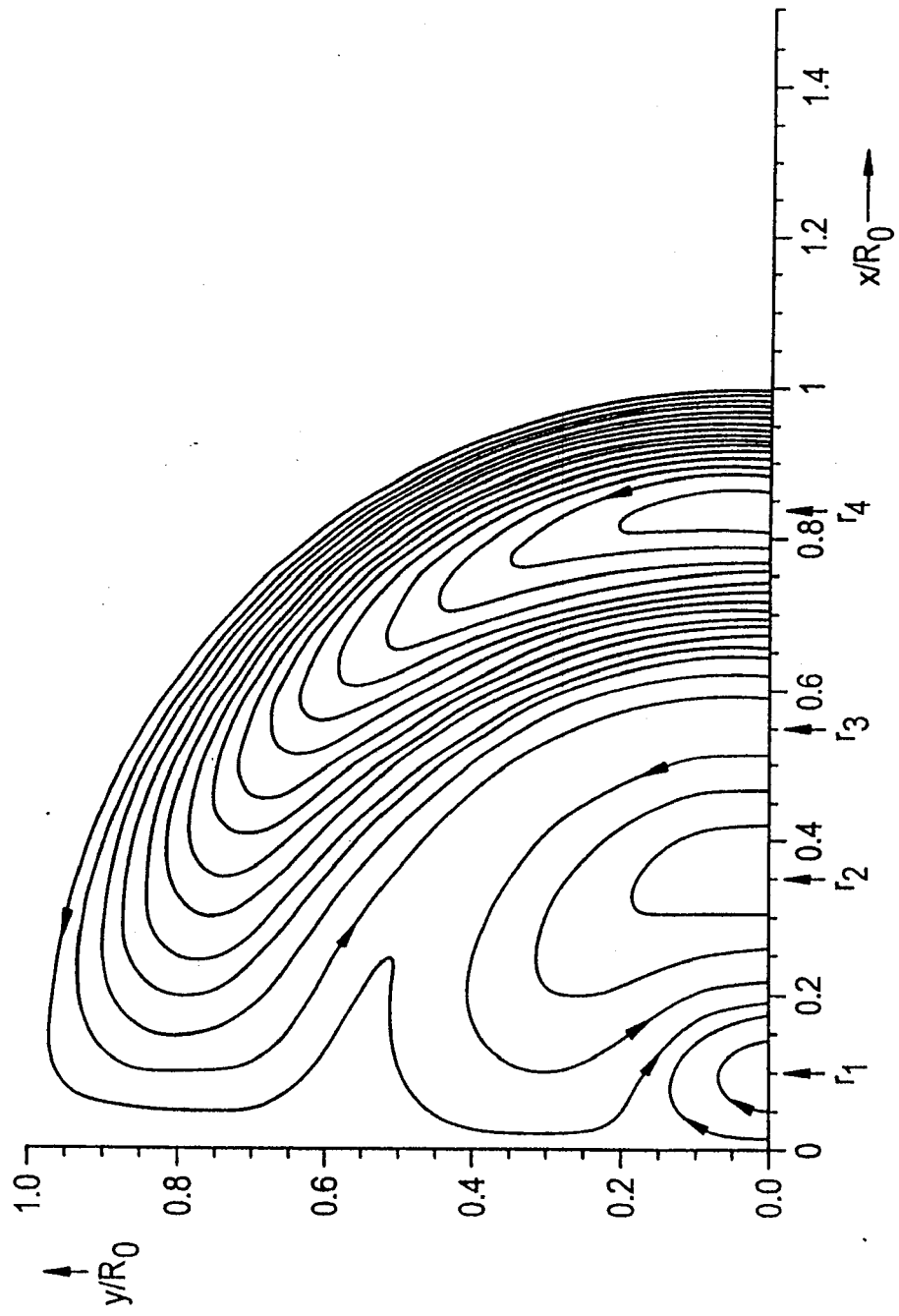
Figure 3:
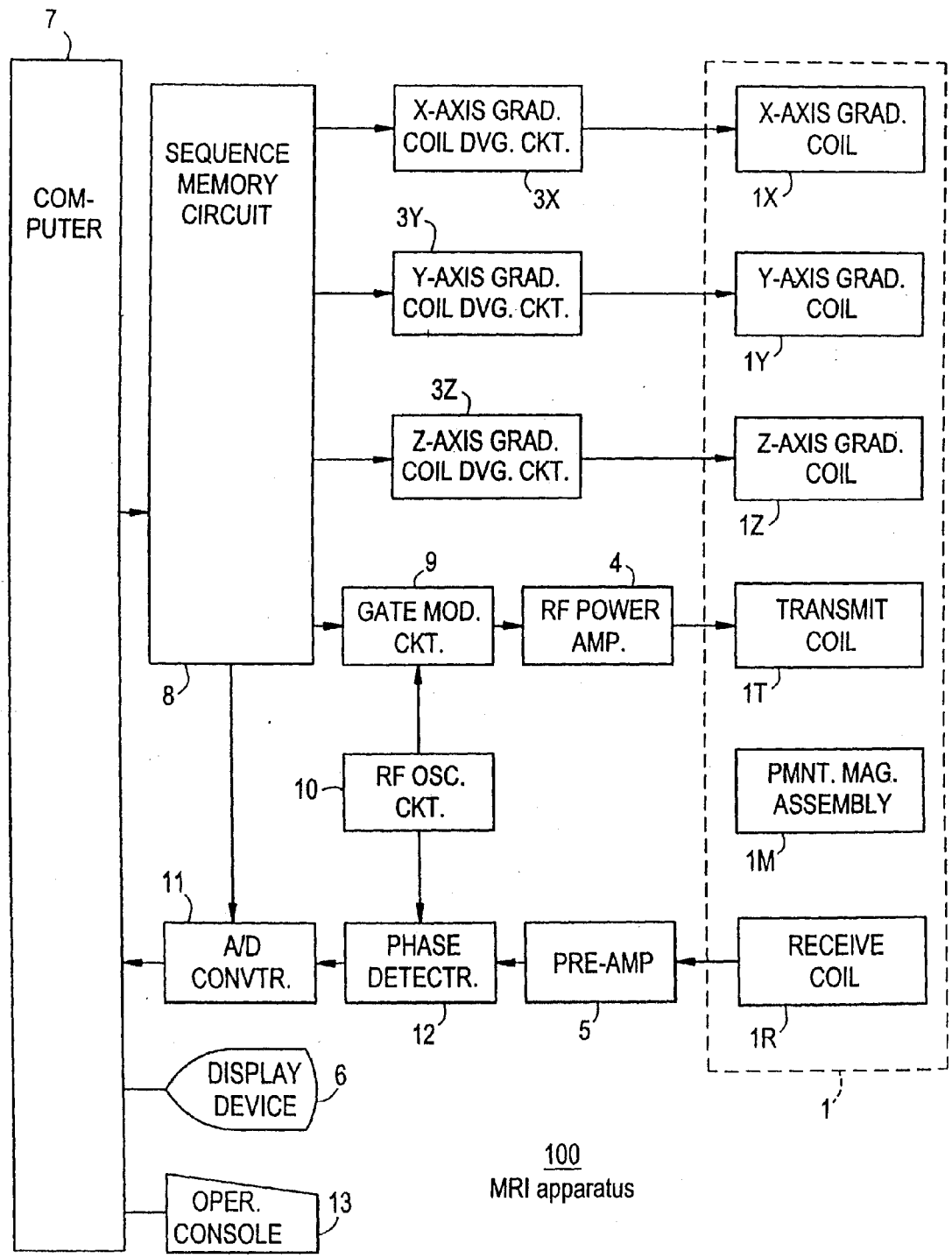
Figure 4:
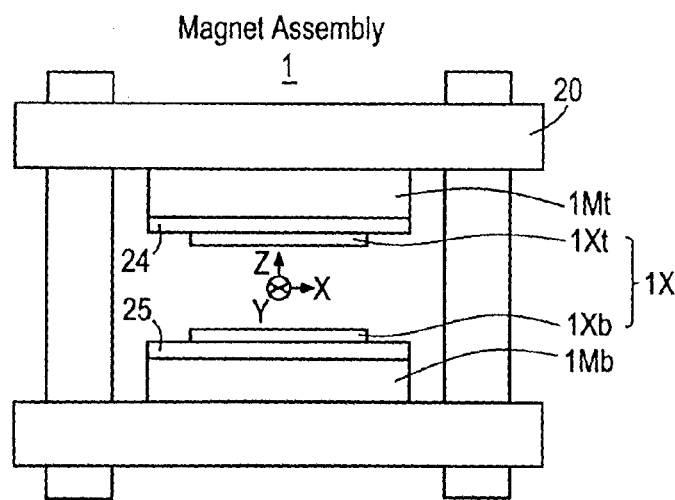

FIG. 12 is a flow chart of the optimization process in Step S2.

In Step V1, an allowable value for the linearity error is determined.

In Step V2, appropriate values for $A_n$, n, $B_m$ and m are assumed. However, an appropriate restriction (for example, restricting the values for n and m) is imposed so that an x-axis electric current distribution profile expressed by the electric current distribution equation with the assumed values for $A_n$, n, $B_m$ and m substituted does not lie in both the positive and negative polarities.

In Step V3, a Z-direction magnetic field $B_{zt}$ generated by the semicircular spiral is calculated at a plurality of magnetic field measurement points.

At this time, the plurality of magnetic field measurement points are selected as points on a sphere that does not contain an electric current element.

The Z-direction magnetic field $B_{zt}$ is calculated by the following equations:

$$B_{zt} = z - component \{\dot{B}_s + \dot{B}_a\}, \quad (4)$$

$$\dot{B}_s = \frac{\mu_0}{4\pi} \int_{-y_0(x)}^{y_0(x)} dy \int_0^{R_0} J_x(x) \frac{d\dot{x} \times (\dot{r} - \dot{x})}{|\dot{r} - \dot{x}|^3}, \quad (5)$$

$$y_0(x) = \sqrt{R_0^2 - x^2} \text{ and}$$

$$\dot{B}_a = \frac{\mu_0}{4\pi} \int_{-\pi/2}^{\pi/2} d\varphi \int_{R_0-\Delta r}^{R_0} J_a \dot{r}' \frac{d\dot{r}' \times (\dot{r} - \dot{r}')}{|\dot{r} - \dot{r}'|^3}, \quad (6)$$

wherein t (1, 2, . . . , T) is the number of the magnetic field measurement point.

Eq. (5) represents a magnetic field vector by the straight-line portion at a magnetic field measurement point t, derived from the Bio-Savart law. The symbol r represents a position vector of the magnetic field measurement point t.

Eq. (6) represents a magnetic field vector by the arc-shaped portion at a magnetic field measurement point t, derived from the Bio-Savart law. The symbol $J_a$ represents an electric current density and $J_a$ is constant.

In Step V4, an ideal Z-direction magnetic field $B_t=\alpha \cdot x$ ($\alpha$ represents a slope of the gradient) is calculated at each magnetic field measurement point t.

In Step V5, values for $A_n$ and $B_m$ are obtained such that the following value E is minimized, by a least squares method or a linear or non-linear programming:

$$E = \sum_{1}^{T} [B_t - B_{zt}(A_n, B_m)]^2. \quad (7)$$

In Step V6, the electric current distribution equation $J_x(x)$ with the values for $A_n$ and $B_m$ obtained at Step V5 substituted is employed to calculate a magnetic field at inspection points on an appropriate line, and obtain a linearity error.

In Step V7, decision is made whether the linearity error falls within the allowable value, and if so, the process is terminated with the return values of current $A_n$, n, $B_m$ and m; otherwise the process goes to Step V8.

In Step V8, decision is made whether the current linearity error can be accepted, and if so (the linearity error is regarded as falling within the allowable value), the process is terminated with the return values of current $A_n$, n, $B_m$ and m; otherwise the process goes to Step V9.

In Step V9, decision is made whether the number of magnetic field measurement points is to be decreased, and if so, the process goes to Step V10; otherwise to Step 11.

In Step V10, the number of magnetic field measurement points is decreased, and the process goes back to Step V5.

In Step V11, decision is made whether the values of n and m are to be increased, and if so, the process goes to Step V12; otherwise to Step V13.

In Step V12, the values of n and m are increased, and the process goes back to Step V2.

In Step V13, a notification is made that a solution could not be obtained. Then, the process is terminated.

According to the MRI apparatus 100, since employing the gradient coils 1X and 1Y having a winding pattern of a semicircular spiral and having an electric current distribution basically expressed by a continuous function that does not lie in both the positive and negative polarities, provides only two locations at which adjacent paths carry electric current flowing in the opposite directions, and besides the paths are well apart from each other, reduction in efficiency in generating a magnetic field can be avoided, thereby reducing electricity consumption. Moreover, since optimization is performed to obtain desired linearity, good linearity can be obtained, and image quality can be improved.

Many widely different embodiments of the invention may be configured without departing from the spirit and the scope of the present invention. It should be understood that the present invention is not limited to the specific embodiments described in the specification, except as defined in the appended claims.

What is claimed is:

1. A gradient coil system comprising:
   a plurality of pairs of conductive windings disposed on generally the same plane and being defined on one side and on another side, each of said pair of windings being formed of a conductive material and of a straight portion and a semi-circular portion on said one side and of a straight portion and a semi-circular portion on said other side, said semi-circular portions being arranged on each of said one side and said other side so as to have a smallest radius for a first semi-circular portion and gradually expanding in radius to a largest radius for an n-th semi-circular portion with said straight portion connecting ends of a corresponding semi-circular portion, said pair of windings being symmetrically disposed with their respective straight portions being adjacent and parallel to each other, wherein an axis dividing said semi-circular portions into two equal parts is defined as an x-axis; and wherein on said one side and on said other side, a straight portion is connected on one side to a semi-circular portion having said smallest radius and another end thereof is connected on said one side to a next semi-circular portion having a next larger radius, and so on in a repeated manner, with one end of said semi-circular portion having said smallest radius acting as one terminal and an end of another straight portion being connected to a semi-circular portion having the largest radius on the one side being connected to an end of a semi-circular portion having the smallest radius on the other side, with a straight por- being connected to an end of a semi-circular portion having the next largest radius on the other side, and so on in a repeated manner, with an end of said semi-circular portion having the largest radius on the other side being connected to an end of a straight portion with the other end thereof being an outlet terminal; and means for passing electric current in the same direction through all of the straight portions on both the one side and the other side and in an opposite direction through said semi-circular portions on both the one side and the other side, with said current being applied to said one terminal and then to the semi-circular portion having the smallest radius on the one side, eventually to the semi-circular portion of the largest radius on the one side, then directly to the semi-circular portion of the smallest radius on the other side, and eventually to the semi-circular portion having the largest radius on the other side, and then directly to the outlet terminal, so that an x-axis electric current distribution is generated which is basically expressed by a continuous function that does not lie in both positive and negative polarities simultaneously.

2. The system of claim 1, wherein said continuous function consists of a combination of orthogonal functions.

3. An MRI apparatus comprising:

a gradient coil system including a a plurality of pairs of conductive windings disposed on generally the same plane and being defined on one side and on another side, each of said pair of windings being formed of a conductive material and of a straight portion and a semi-circular portion on said one side and of a straight portion and a semi-circular portion on said other side, said semi-circular portions being arranged on each of said one side and said other side so as to have a smallest radius for a first semi-circular portion and gradually expanding in radius to a largest radius for an n-th semi-circular portion with said straight portion connecting ends of a corresponding semi-circular portion, said pair of windings being symmetrically disposed with their respective straight portions being adjacent and parallel to each other, wherein an axis dividing said semi-circular portions into two equal parts is defined as an x-axis; and wherein on said one side and said other side, a straight portion is connected on one side to a semi-circular portion having said smallest radius and another end thereof is connected on one side to a next semi-circular portion having a next larger radius, and so on in a repeated manner, with one end of said semi-circular portion having said smallest radius acting as one terminal, and an end of another straight portion being connected to a semi-circular portion having the largest radius on one side being connected to an end of a semi-circular portion having the smallest radius on the other side, with a straight portion being connected to an end of a semi-circular portion having the next largest radius on the other side, and so on in a repeated manner, with an end of said semi-circular portion having the largest radius on the other side being connected to an end of a straight portion with the other end thereof being an outlet terminal; and means for passing electric current in the same direction through all of the straight portions on both the one side and the other side and in an opposite direction through said semi-circular portions on both the one side and the other side without any current passing across the semi-circular portions on either the one side or the other side, said current being applied to said one terminal and then to the semi-circular portion having the smallest radius on the one side, eventually to the semi-circular portion of the largest radius on the one side, then directly to the semi-circular portion of the smallest radius on the other side, and eventually to the semi-circular portion having the largest radius on the other side, and then directly to the outlet terminal, so that an x-axis electric current distribution is generated which is basically expressed by a continuous function that does not lie in both positive and negative polarities simultaneously.

4. The apparatus of claim 3, wherein said continuous function consists of a combination of orthogonal functions.

5. An MRI apparatus comprising:

a magnetic structure defining a space into which a subject is placed for examination, and comprising a magnet;

RF coil means for providing an RF signal to said magnetic structure;

a gradient coil system for providing gradient signals to said magnetic structure; and means for providing an image of said subject from signals received from said subject exposed to said RF signal and said gradient signals;

said gradient coil system comprising:

a plurality of pairs of conductive windings disposed on generally the same plane and being defined on one side and on another side, each of said pair of windings being formed of a conductive material and of a straight portion and a semi-circular portion on said one side and of a straight portion and a semi-circular portion on said other side, said semi-circular portions being arranged on each of said one side and said other side so as to have a smallest radius for a first semi-circular portion and gradually expanding in radius to a largest radius for an n-th semi-circular portion with said straight portion connecting an end of a corresponding semi-circular portion, said pair of windings being symmetrically disposed with their respective straight portions being adjacent and parallel to each other, wherein an axis dividing said semi-circular portions into two equal parts is defined as an x-axis; and wherein on said one side and on said other side, a straight portion is connected on one side to a semi-circular portion having said smallest radius and another end thereof is connected on one side to a next semi-circular portion having a next larger radius, and so on in a repeated manner, with one end of said semi-circular portion having said smallest radius acting as one terminal and an end of another straight portion being connec- to a semi-circular portion having the largest radius on one side being connected to an end of a semi-circular portion having the smallest radius on the other side, with a straight portion being connected to an end of a semi-circular portion having the next largest radius on the other side, and so on in a repeated manner, with an end of said semi-circular portion having the largest radius on the other side being connected to an end of a straight portion with the other end thereof being an outlet terminal; and means for passing electric current in the same direction through all of the straight portions on both the one side and the other side and in an opposite direction through said semi-circular portions on both the one side and the other side, with said current being applied to said one terminal and then to the semi-circular portion having the smallest radius on the one side, eventually to the semi-circular portion of the largest radius on the one side, then directly to the semi-circular portion of the smallest radius on the other side, and eventually to the semi-circular portion having the largest radius on the other side, and then directly to the outlet terminal, without the current passing over semi-circular portions on either one side or the other side, so that an x-axis electric current distribution is generated which is basically expressed by a continuous function that does not lie in both positive and negative polarities simultaneously and errors due to non-linearity at the edges of the gradient coils are avoided.

6. The apparatus of claim 5, wherein said continous function comprises a combination of orthogonal functions.

7. The apparatus of claim 5, wherein said magnet structure comprises a superconductive magnet.

8. The apparatus of claim 5, wherein said gradient coil system is driven based on a pulse sequence using a spin echo process.

9. The apparatus of claim 5, wherein said magnet structure comprises:

a pair of yokes;

a pair of permanent magnets attached to said yokes;

a pair of magnetic field conditioning plates disposed on opposite faces of said pair of permanent magnets; and a plurality of gradient coil systems, one of said gradient coil systems being disposed on opposite surfaces of said magnetic field conditioning plates.

10. The apparatus of claim 9, wherein said continuous function consists of a combination of orthogonal functions.

11. The apparatus of claim 10, wherein said gradient coil system is driven based on a pulse sequence using a spin echo process.

12. The apparatus of claim 5, wherein each of said pair of windings further comprises an arch shaped portion.

13. The apparatus of claim 12, wherein said pluralitY of pairs of conductive windings produce a distribution of large magnetic fields at a center thereof and a trailing edge thereof.

* * * * *

UNITED STATES PATENT AND TRADEMARK OFFICE
CERTIFICATE OF CORRECTION

PATENT NO.    : 6,529,003 B2
DATED         : March 4, 2003
INVENTOR(S)   : Takao Goto and Yuji Inoue It is certified that error appears in the above-identified patent and that said Letters Patent is hereby corrected as shown below:

The title page, should be deleted to appear as per attached title page.
The sheets of drawings consisting of figures 1-12 should be deleted to appear as per attached figures 1-12.

Signed and Sealed this

Second Day of December, 2003

JAMES E. ROGAN
*Director of the United States Patent and Trademark Office*

United States Patent
Goto et al.

(10) Patent No.: US 6,529,003 B2
(45) Date of Patent: *Mar. 4, 2003

(54) GRADIENT COIL SYSTEM FOR USE IN MRI APPARATUS WITH UNIQUE WIRING ARRANGEMENT

(75) Inventors: Takao Goto, Tokyo (JP); Yuji Inoue, Tokyo (JP)

(73) Assignee: GE Yokogawa Medical Systems, Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/546,223

(22) Filed: Apr. 10, 2000

(65) Prior Publication Data

US 2002/0135368 A1 Sep. 26, 2002

(30) Foreign Application Priority Data

Jun. 21, 1999 (JP) .......................... 11-173553

(51) Int. Cl.$^7$ .......................... G01V 3/00
(52) U.S. Cl. .......................... 324/318; 324/322
(58) Field of Search .......................... 324/318, 322, 324/320, 309, 307

(56) References Cited

U.S. PATENT DOCUMENTS

| | | | | |
|---|---|---|---|---|
| 4,636,728 A | * | 1/1987 | Compton et al. | 324/309 |
| 4,646,024 A | * | 2/1987 | Schenck et al. | 324/307 |
| 4,686,473 A | * | 8/1987 | Chesneau et al. | 324/319 |
| 4,829,252 A | * | 5/1989 | Kaufman | 324/309 |
| 4,840,700 A | * | 6/1989 | Edelstein et al. | 216/22 |
| 4,862,086 A | | 8/1989 | Maeda | |
| 5,166,619 A | * | 11/1992 | Ries | 324/318 |
| 5,283,544 A | | 2/1994 | Sakurai et al. | 335/297 |
| 5,363,078 A | * | 11/1994 | Ries et al. | 324/319 |
| 5,581,187 A | * | 12/1996 | Pausch | 324/318 |
| 5,610,521 A | * | 3/1997 | Zou et al. | 324/318 |
| 5,630,415 A | * | 5/1997 | Kaufman | 324/318 |
| 5,631,616 A | * | 5/1997 | Ohta et al. | 324/318 |
| 5,706,575 A | | 1/1998 | Kaufman | |
| 5,760,582 A | | 6/1998 | Morrone | |
| 5,864,275 A | * | 1/1999 | Ohashi et al. | 324/319 |
| 5,874,831 A | * | 2/1999 | Yi et al. | 324/318 |
| 5,936,502 A | * | 8/1999 | Englund et al. | 335/299 |
| 6,054,854 A | * | 4/2000 | Kawamoto | 324/318 |
| 6,144,204 A | * | 11/2000 | Sementchenko | 324/318 |
| 6,249,121 B1 | * | 6/2001 | Boskamp et al. | 324/318 |
| 6,285,188 B1 | * | 9/2001 | Sakakura | 324/318 |

FOREIGN PATENT DOCUMENTS

| | | |
|---|---|---|
| JP | 1025510 | 1/1989 |
| JP | 3188827 | 8/1991 |
| JP | 6014900 | 1/1994 |
| JP | 08335511 A * | 12/1996 |
| JP | 408335511 A * | 12/1996 |

OTHER PUBLICATIONS

Haiying Liu "True energy iminmal and finite sized biplanar gradient coil design for MRI" IEEE Transaction on Medical Imaging, Oct. 1998, IEEE, vo. 17,No. 5, pp. 826–830. (copy filed herewith).

* cited by examiner

*Primary Examiner*—Edward Lefkowitz
*Assistant Examiner*—Dixomara Vargas
(74) *Attorney, Agent, or Firm*—Moonray Kojima

(57) ABSTRACT

In order to obtain good linearity without reducing efficiency in generating a magnetic field, a winding pattern of one semicircular spiral is assumed; an electric current distribution is expressed by a continuous function $J_x(x)$ such that an x-axis electric current distribution profile does not lie in both the positive and negative polarities; parameters of the continuous function $J_x(x)$ are optimized so that desired linearity can be obtained; and a position of a straight-line portion 1XtlL of the semicircular spiral is determined so that the electric current distribution profile given by the optimized continuous function $J_x(x)$ is fulfilled. The resulting pattern is symmetrically duplicated to generate a gradient coil unit 1Xt, and a plurality of the gradient coil units 1Xt are combined to form a gradient coil.

13 Claims, 8 Drawing Sheets

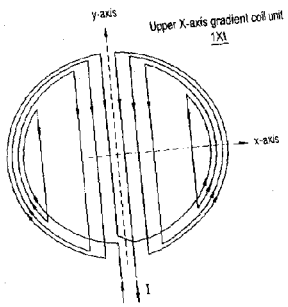

100
MRI apparatus

Magnet Assembly

X-axis gradient coil
1X

FIG. 7

Gradient Coil Design Procedure

S1: Assume a winding pattern of one semicircular spiral and express its x-axis electric current distribution by the following electric current distribution equation:

$$J_x(x) = \sum_n A_n \cdot \sin\left(\frac{\pi}{2} n \frac{x}{R_0}\right) + \sum_m B_m \cdot \sin\left(\frac{\pi}{2} m \frac{x}{R_0}\right),$$

wherein the x-axis is an axis dividing the semicircular spiral into two equal parts, $R_0$ is a maximum radius, and $A_n$, n, $B_m$ and m are parameters to be manipulated for optimization.

S2: Assume appropriate values for $A_n$, n, $B_m$, and m (with a proviso that an x-axis electric current distribution profile expressed by the electric current distribution equation with the assumed values for $A_n$, n, $B_m$ and m substituted does not lie in both the positive and negative polarities); Calculate a linearity error of a magnetic field at a plurality of magnetic field measurement points; Manipulate $A_n$, n, $B_m$ and m so that the linearity error falls within an allowable value to obtain optimum values for $A_n$, n, $B_m$ and m.

S3: Define a value of the area $A_p$ of a region enclosed by the electric current distribution profile $J_x(x)$ and a line $J_x = 0$ divided by the number N of positions at which the windings of the straight-line portion intersect the x-axis (i.e., the number of windings) as $\Delta A_p$.

S4: Separate the region enclosed by the electric current distribution profile $J_x(x)$ and the line $J_x = 0$ by $\Delta A_p$ into sub-regions; Define an x-position in the middle of each sub-region as a position at which each winding of the straight-line portion of the semicircular spiral intersects the x-axis.

S5: Form an arc-shaped portion of the semicircular spiral as a semicircle having a radius of $R_0$ to obtain a winding pattern of a semicircular spiral on one side.

S6: Symmetrically duplicate the winding pattern on one side with the straight-line portions adjacent to each other to generate a winding pattern of a gradient coil unit.

S7: Combine a plurality of the gradient coil units.

END